(12) United States Patent
Buzaglo et al.

(10) Patent No.: US 12,020,417 B2
(45) Date of Patent: Jun. 25, 2024

(54) METHOD AND SYSTEM FOR CLASSIFYING DEFECTS IN WAFER USING WAFER-DEFECT IMAGES, BASED ON DEEP LEARNING

(71) Applicant: CAMTEK LTD., Migdal Ha'emek (IL)

(72) Inventors: Isaac Daniel Buzaglo, Migdal Ha'emek (IL); Nir Dromi, Migdal Ha'emek (IL)

(73) Assignee: CAMTEK LTD., Migdal Ha'emek (IL)

(*) Notice: Subject to any disclaimer, the term of this patent is extended or adjusted under 35 U.S.C. 154(b) by 89 days.

(21) Appl. No.: 16/932,717

(22) Filed: Jul. 18, 2020

(65) Prior Publication Data

US 2021/0334946 A1 Oct. 28, 2021

Related U.S. Application Data

(60) Provisional application No. 63/015,101, filed on Apr. 24, 2020.

(51) Int. Cl.
*G06T 7/00* (2017.01)
*G01N 21/95* (2006.01)
(Continued)

(52) U.S. Cl.
CPC ......... *G06T 7/001* (2013.01); *G01N 21/9501* (2013.01); *G06T 7/90* (2017.01);
(Continued)

(58) Field of Classification Search
CPC ....... G01N 21/9501; G06T 7/001; G06T 7/90; G06T 2207/10024; G06T 2207/10116;
(Continued)

(56) References Cited

U.S. PATENT DOCUMENTS 6,334,097 B1 * 12/2001 Yoshitake ............... H01L 22/20
702/185
6,947,936 B1 * 9/2005 Suermondt ........... G06F 16/353
(Continued)

FOREIGN PATENT DOCUMENTS

CN 1983308 A * 6/2007 ............. G06N 7/005
CN 109564588 A * 4/2019 ........... G06F 16/334
(Continued)

OTHER PUBLICATIONS

De Stefano et al. ("Learning Bayesian Networks by Evolution for Classifier Combination," 10th International Conference on Document Analysis and Recognition; Date of Conference: Jul. 26-29, 2009) (Year: 2009).*

(Continued)

*Primary Examiner* — Manav Seth (57) ABSTRACT

The present disclosure provides method and system 100 for classifying defects in wafer using wafer defect images, based on deep learning network. Embodiments herein uses synergy between several modalities of the wafer defect images for the classification decision. Further, by adding a mixture of modalities, information may be obtained from different sources such as color image, ICI, the black and white image, to classify the defect image. In addition to mixture of modalities, a reference image may be used for each modality. The reference image of each modality image is provided to deep learning models to concentrate on the defect itself and not on the related underlying lithography of the defect image. Further, the reference image may be provided to the training process of the deep learning models that may significantly reduce the number of labelled images and the training epochs required for convergence of the deep learning model.

19 Claims, 8 Drawing Sheets

(51) Int. Cl.
G06T 7/90 (2017.01)
H01L 21/66 (2006.01)

(52) U.S. Cl.
CPC .... H01L 22/12 (2013.01); *G06T 2207/10024* (2013.01); *G06T 2207/10116* (2013.01); *G06T 2207/20081* (2013.01); *G06T 2207/20084* (2013.01); *G06T 2207/20221* (2013.01); *G06T 2207/30148* (2013.01)

(58) Field of Classification Search
CPC . G06T 2207/20081; G06T 2207/20084; G06T 2207/20221; G06T 2207/30148; H01L 22/12
See application file for complete search history.

(56) References Cited

U.S. PATENT DOCUMENTS

| | | | |
|---|---|---|---|
| 2005/0185845 A1* | 8/2005 | Luo | G06V 10/809 |
| | | | 382/190 |
| 2009/0181384 A1* | 7/2009 | Nekarda | G16B 20/20 |
| | | | 435/6.14 |
| 2017/0220903 A1* | 8/2017 | Hertzmann | G06F 18/41 |
| 2018/0107928 A1* | 4/2018 | Zhang | G06N 3/082 |
| 2019/0188840 A1 | 6/2019 | Kwon et al. | |
| 2019/0294923 A1* | 9/2019 | Riley | G06V 10/764 |
| 2020/0082197 A1* | 3/2020 | Alletto | G06V 10/764 |
| 2021/0090274 A1* | 3/2021 | Fu | G06T 7/50 |
| 2021/0151034 A1* | 5/2021 | Hasan | G10L 15/16 |
| 2021/0209418 A1* | 7/2021 | Badanes | G06F 18/2155 |
| 2021/0318379 A1* | 10/2021 | Millican | G06N 20/00 |
| 2023/0306009 A1* | 9/2023 | Brendle | G06F 16/2282 |
| | | | 707/803 |

FOREIGN PATENT DOCUMENTS

| | | | | |
|---|---|---|---|---|
| JP | 2001135692 | | 5/2001 | |
| JP | 2016162276 A | * | 9/2016 | |
| JP | 2019124591 | | 7/2019 | |
| TW | 201816670 | | 5/2018 | |
| WO | WO-2014198595 A1 | * | 12/2014 | ....... G06F 17/30707 |
| WO | WO-2015044629 A1 | * | 4/2015 | .......... G06F 11/3072 |

OTHER PUBLICATIONS

De Stefano et al. ("Using Bayesian Network for combining classifiers," 14th International Conference on Image Analysis and Processing; Date of Conference: Oct. 10-14, 2007) (Year: 2007).*
Kijsirikul et al. ("Multiclass Support Vector Machines Using Adaptive Directed Acyclic Graph," Proceedings of the 2002 International Joint Conference on Neural Networks; Date of Conference: May 12-17, 2002) (Year: 2002).*
Wang et al. ("Improving Classification Efficiency of Orthogonal Defect Classification via a Bayesian Network Approach," International Conference on Computational Intelligence and Software Engineering; Date of Conference: Dec. 11-13, 2009) (Year: 2009).*
Alshdaifat et al. (A Directed Acyclic Graph (DAG) Ensemble Classification Model: An Alternative Architecture for Hierarchical Classification, International Journal of Data Warehousing and Mining, 2017) (Year: 2017).*
Li et al. ("Enhancing Accuracy of Multi-Class Support Vector Machine by Applying Directed Acyclic Graphs," 2017 4th International Conference on Information Science and Control Engineering; Date of Conference: Jul. 21-23, 2017) (Year: 2017).*
Avinash Burla, Tobias Haist, Wolfram Lyda, and Wolfgang Osten, "Genetic programming applied to automaticalgorithm design in multi-scale inspection systems," Optical Engineering, vol. 51, No. 6, 067001, Jun. 5, 2012. http://dx.doi.org/10.1117/1.OE.51.6.067001.
Office Action—corresponding TW Application No. 109126784, dated Mar. 23, 2021.
Office Action—corresponding JP Application No. 2020-126825, dated Jul. 12, 2022, 2 pages.

* cited by examiner

FIG. 6b

METHOD AND SYSTEM FOR CLASSIFYING DEFECTS IN WAFER USING WAFER-DEFECT IMAGES, BASED ON DEEP LEARNING

RELATED APPLICATION

This application claims the benefit and priority to U.S. Provisional Application No. 63/015,101, filed Apr. 24, 2020.

FIELD OF THE PRESENT INVENTION

The present disclosure generally relates to neural networks for semiconductor applications. Particularly, but not exclusively, the present disclosure relates to a method and system for classifying defects in wafer using wafer defect images, based on deep learning network.

BACKGROUND OF THE PRESENT INVENTION

Generally, semiconductor substrate (i.e. wafer) fabrication techniques have been consistently improved for incorporating an increasing number of features and multiple levels of the semiconductor devices into a smaller surface area of the semiconductor wafer. Accordingly, photolithography/lithography processes may be used for semiconductor wafer fabrication, that are more sophisticated to allow the incorporation of increasing number of features into the smaller surface area of the semiconductor wafer (i.e. for achieving higher performance of the semiconductor wafers). Consequently, the size of potential defects on semiconductor wafers can be in micron to submicron range, due to incorporation of increasing number of features. Also, defects in wafer can be, for example, defects arising from real and physical phenomena of the wafer, and false events/nuisance defects (i.e. the nuisance can be an irregularity or false defect on the wafer but is not a defect of interest).

Conventionally, defects in semiconductor wafers may be inspected based on obtaining higher resolution images of the wafers using at least one of a high magnification optical system or a scanning electron microscope (SEM). The higher resolution images of the defects in wafer may be generated for determining different parameters of the defects such as thickness, roughness, size and so on. Further, conventional systems disclose an imaging system that may be configured for scanning multimodal sources of energy (e.g., light or electrons) over a physical version of the wafer and thereby generating actual images for the physical version of the wafer. Also, the defect areas may be determined by comparing the defect image with a reference image for anomalies detection and classification of defect. Conventional system may use a single deep learning model for anomalies detection and classification of defects in the wafer. However, conventional systems may not accurately determine the defects in wafer by considering different aspects/modalities of defect images corresponding to wafer.

SUMMARY OF THE PRESENT INVENTION

The present disclosure provides method and system for classifying defects in wafer using wafer defect images, based on deep learning network. Embodiments herein use synergy between several modalities of the wafer defect images to make a classification decision. Further, by adding a mixture of modalities, information may be obtained from different sources such as: a color image, an Inner Crack Imaging (ICI) image(s), a black and white image, to classify the defect image. In addition to mixture of modalities, a reference image (for example, a golden die image) may be used for each modality. The advantage of the reference image provided to each modality image is to concentrate on the defect itself and not on the related underlying lithography of the defect image. Further, the reference image may be provided to the training process of the deep learning models that may significantly reduce the number of labelled images and the training epochs (i.e. when an entire dataset is passed both forward and backward through the deep learning neural network) required for convergence of the deep learning model.

Embodiments herein may utilize the Direct Acyclic Graph (DAG) as a combination of deep learning models, and each deep learning may treat a different aspect of the problem or a different modality of the defect in wafer using defect wafer images. Further, the DAG can be created having any number of models and plurality of different images per deep learning model. Further, a post processing decision module may be configured to combine parameters such as two aspects of the defect investigated images and resulting labels of the defect investigated images, a value(s) from each deep learning model of the DAG, and the metrology information (metadata) of the defect or collected previously in the scanner machine. The DAG comprising deep learning models may be used for accurately classifying the defects in wafer using wafer defect images, based on deep learning network.

The features disclosed in the present disclosure helps during fabrication in accurately detecting defects and classifying the defects in the wafer by analyzing plurality of modalities of the wafer defect image.

In an aspect, a computer implemented method of classifying and inspecting for defects in semiconductor wafers includes: providing one or more imaging units; providing a computing unit; receiving a plurality of images taken from one or more dies on a semiconductor wafer under inspection by the one or more imaging units, wherein the plurality of images are captured using a plurality of imaging modalities; providing one or more Machine Learning (ML) models, the one of more ML modes being associated with at least a computer processor, a database and a memory associated with the computing unit; providing the plurality of images to the one or more (ML) models from a plurality of ML models, the computer processor identifying and classifying one or more defects present in the semiconductor wafer into one or more defect classes, wherein the plurality of ML models are configured in a Directed Acyclic Graph (DAG) architecture, wherein each node in the DAG architecture represents a ML model, wherein the one or more ML models are configured as root nodes in the DAG architecture; the plurality of ML models is configured to be trained to classify the one or more defects on one or more dies in the semiconductor wafer, wherein the training comprises: providing a plurality of labelled images and a plurality of reference images of the semiconductor wafer stored in the database to the one or more ML models from a plurality of ML models; configuring each ML model from the plurality of ML models to classify the plurality of labelled images into one or more defect classes using corresponding reference image from the plurality of reference images; storing the one or more defect classes; inspecting one or more dies contained on a semiconductor wafer for defects by imaging the one or more dies; attempting to match the images of the one or more dies to any one or more of the one or more defect classes; if a match exists between the one or more dies and the one or more defect classes, classifying the one or more matching dies as defective, and, communicating the identity of and rejecting as defective the one or more defective dies.

In another aspect, the one or more ML models are provided with the plurality of images and the plurality of labelled images belonging to an imaging modality from the plurality of imaging modalities. Further, each of the plurality of ML models is one of, a supervised model a semi-supervised model and an unsupervised model.

In a further aspect, the plurality of modalities includes at least one of: X-ray imaging, Inner-Crack-Imaging (ICI), grayscale imaging, black and white imaging, and color imaging. Further, the plurality of ML models are deep learning models.

In yet another aspect, the plurality of labelled images comprises labels related to the one or more defect classes, wherein the plurality of labelled images is generated using a labelling model.

In an additional aspect, the computing unit of the present invention includes one or more processors and a memory configured to perform the methods steps above.

In an aspect, a method of classifying defects in semiconductor wafers includes: capturing a plurality of images of a semiconductor wafer under inspection by one or more imaging units, wherein the plurality of images are captured using a plurality of imaging modalities; providing the plurality of images to one or more Machine Learning (ML) models from a plurality of ML models, to identify and classify one or more defects in the semiconductor wafer into one or more defect classes, wherein the plurality of ML models are configured in a Directed Acyclic Graph (DAG) architecture, wherein each node in the DAG architecture represents a ML model, wherein the one or more ML models are configured as root nodes in the DAG architecture; wherein the plurality of ML models are trained to classify the one or more defects in the semiconductor wafer, and wherein the training comprises: providing a plurality of labelled images and a plurality of reference images of the semiconductor wafer stored in the database, to the one or more ML models from the plurality of ML models; and, configuring each ML model from the plurality of ML models to classify the plurality of labelled images into a one or more defect classes using corresponding reference image from the plurality of reference images.

In another aspect, the one or more ML models are provided with the plurality of images and the plurality of labelled images belonging to an imaging modality from the plurality of imaging modalities. Further, each of the plurality of ML models is one of, a supervised model a semi-supervised model and an unsupervised model. The plurality of modalities includes at least one of: X-ray imaging, Inner-Crack-Imaging (ICI), grayscale imaging, black and white imaging, and color imaging. Each of the plurality of ML models are deep learning models.

In yet a further aspect, the plurality of labelled images comprises labels related to the one or more defect classes, wherein the plurality of labelled images is generated using historical images of the semiconductor wafer. One of a late fusion technique or an early fusion technique or a hybrid fusion technique is used to combine features extracted from the plurality of modalities. Further including post-processing wherein post-processing includes accurately classifying the plurality of images into the one or more defect classes using the classification information from each of the plurality of ML models.

In an aspect, a system for classifying and inspecting for defects in semiconductor wafers includes: one or more imaging units, the one or more imaging units being configured to capture a plurality of images of one or more dies on a semiconductor wafer under inspection by one or more imaging units, wherein the plurality of images are captured using a plurality of imaging modalities; a computing unit, the computer unit including at least a computer processor, a database and a memory, and being configured to: provide the plurality of images to one or more Machine Learning (ML) models from a plurality of ML models, to identify and classify one or more defects in one or more dies on the semiconductor wafer into one or more defect classes, wherein the plurality of ML models are configured in a Directed Acyclic Graph (DAG) architecture, wherein each node in the DAG architecture represents a ML model, wherein the one or more ML models are configured as root nodes in the DAG architecture; the plurality of ML models being configured to be trained to classify the one or more defects on the one or more dies in the semiconductor wafer, wherein the computing unit is configured to: provide a plurality of labelled images and a plurality of reference images of the semiconductor wafer stored in the database to the one or more ML models from the plurality of ML models;

configure each ML model from the plurality of ML models to classify the plurality of labelled images into a one or more defect classes using corresponding reference image from the plurality of reference images; and then storing the defect classes and rejecting or accepting the one or more dies under inspection respectively depending on the existence of a match of one or more dies to the one or more defect classes.

In another aspect, the one or more imaging units include, at least one of, an Automated Optical Inspection (AOI) apparatus, an Automated X-ray Inspection (AXI) apparatus, a Joint Test Action Group (JTAG) apparatus, and an In-circuit test (ICT) apparatus. Further, the computing unit receives the plurality of labelled images comprising comprises labels related to the one or more defect classes from a labelling model, wherein the labelling model generates the plurality of labelled images using historical images of the semiconductor wafer.

In yet another aspect, one of a late fusion technique or an early fusion technique or a hybrid fusion technique is used to combine features extracted from the plurality of modalities. The computing unit is further configured to post-process the an output of the plurality of ML models, wherein the computing unit accurately classifying the plurality of images into the one or more defect classes using the classification information from each of the plurality of ML models.

BRIEF DESCRIPTION OF THE DRAWINGS

The embodiments of the disclosure itself, as well as a preferred mode of use, further objectives and advantages thereof, will best be understood by reference to the following detailed description of an illustrative embodiment when read in conjunction with the accompanying drawings. One or more embodiments are now described, by way of example only, with reference to the accompanying drawings in which.

The figures depict embodiments of the disclosure for purposes of illustration only. One skilled in the art will readily recognize from the following description that alternative embodiments of the structures and methods illustrated herein may be employed without departing from the principles of the disclosure described herein.

DETAILED DESCRIPTION OF THE PRESENT INVENTION

The foregoing has broadly outlined the features and technical advantages of the present disclosure in order that the detailed description of the disclosure that follows may be better understood. It should be appreciated by those skilled in the art that the conception and specific embodiment disclosed may be readily utilized as a basis for modifying or designing other structures for carrying out the same purposes of the present disclosure.

The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

Figure 1:
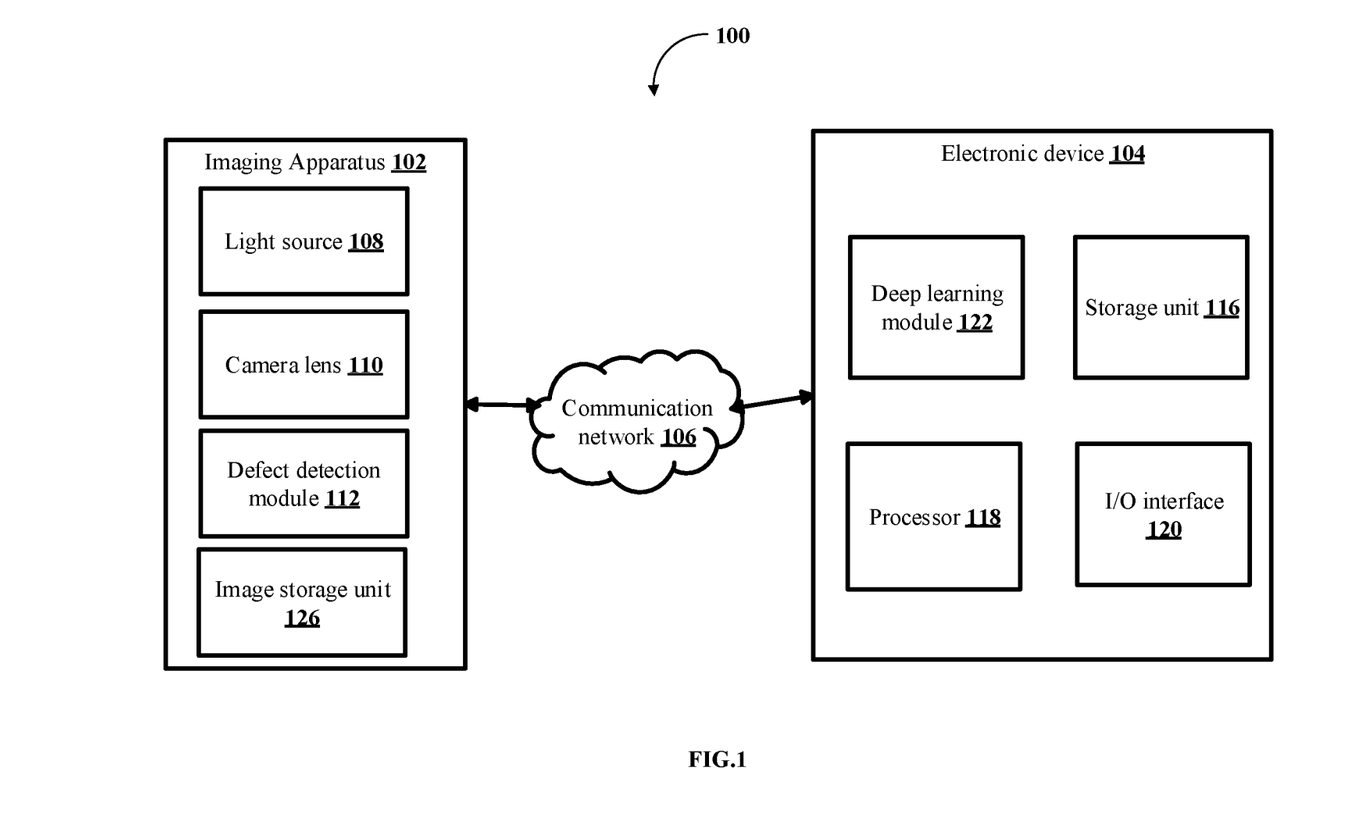
FIG. 1 illustrates a block diagram of a system for classifying defects in wafer using wafer defect images, based on deep learning network, in accordance with some embodiments of the present disclosure.

FIG. 1 illustrates a block diagram of a system 100 for classifying defects in wafer using wafer defect images, based on deep learning network, in accordance with some embodiments of the present disclosure.

As used throughout the present disclosure, the term "wafer" generally refers to substrates formed of a semiconductor or non-semiconductor material. For example, a semiconductor or non-semiconductor material may include, but are not limited to, monocrystalline silicon, gallium arsenide, indium phosphide, and so on. A wafer may include one or more layers, such layers may include, for example, but are not limited to, a resist, a dielectric material, a conductive material, a semi-conductive material, and so on. For instance, one or more layers formed on a wafer may be patterned or un-patterned. For example, a wafer may include a plurality of dies, each having repeatable patterned features. Formation and processing of such layers of material may result in completed devices. Further, as used herein, the term "surface defects" or "defects" refers to both defects that are located entirely above the upper surface of the wafer (e.g., particles) and defects that are located partially below the upper surface of the wafer or entirely below the upper surface of the wafer. Accordingly, classification of defects can be particularly useful for semiconductor materials such as wafers and materials formed on wafers. Further, distinguishing between surface and subsurface defects could particularly be important for bare silicon wafers, silicon on insulator (SOI) films, strained silicon films, and dielectric films. Embodiments herein can be used to inspect a wafer containing silicon or having a silicon-containing layer formed thereon such as silicon carbide, carbon doped silicon dioxide, Silicon on Insulator (SOI), strained silicon, silicon-containing dielectric films, and so on.

In the embodiment of FIG. 1, the system 100 includes an imaging apparatus 102 and an electronic device 104. The imaging apparatus 102 is associated with the electronic device 104 via a communication network 106. The communication network 106 can be a wired network or a wireless network. In an example, the imaging apparatus 102 can be at least one of, but not limited to, an Automated Optical Inspection (AOI) apparatus, an Automated X-ray Inspection (AXI) apparatus, a Joint Test Action Group (JTAG) apparatus, an In-circuit test (ICT) apparatus, and so on. The imaging apparatus 102 includes at least one of, but not limited to, a light source 108, a camera lens 110, a defect detection module 112, and an image storage unit 126. For instance, the defect detection module 112 associated with the imaging apparatus 102 may detect a plurality of surface feature defects of wafer, such as at least one of, but not limited to, silicon nodules (i.e. bumps), scratches, stains, dimensional defects such as open circuits, shorts and thinning of the solder, and so on. Further, the defect detection module 112 can also detect incorrect components, missing components and incorrectly placed components, as the imaging apparatus 102 can be able to perform all the visual checks.

Further, the electronic device 104 can be at least one of, but not limited to, a mobile phone, a smart phone, a tablet, a handheld device, a phablet, a laptop, a computer, a Personal Digital Assistant (PDA), a wearable computing device, a Virtual/Augmented display device, an IoT device, and so on. The electronic device 104 further includes, a storage unit 116, a processor 118 and an input/output (I/O) interface 120. Furthermore, the electronic device 104 includes a deep learning module 122. The deep learning module 122 causes the electronic device 104 to classify defects in wafer using wafer defect images obtained from the imaging apparatus 102. Also, the electronic device 104 may include an application management framework for classifying defects in wafer using deep learning network. The application management framework may comprise different modules and sub modules to execute the operation of classifying defects in wafer using wafer defect images, based on deep learning network. Further, the modules and sub modules can include at least one of software modules or hardware modules or both.

Accordingly, the embodiments described herein are configured for image-based wafer process control and yield improvement. For example, an embodiment herein relates to a system and method for classifying defects in wafer using wafer defect images, based on a deep learning network.

In an embodiment, the imaging apparatus 102 may be configured to capture images of the wafer placed in the imaging apparatus 102. For example, the images may include at least one of the images such as inspection images, optical or electron beam images, wafer inspection images, optical and SEM based defect review images, simulated images, clips from a design layout, and so on. Further, the imaging apparatus 102 may be then configured to store the captured images in the image storage unit 126 associated with the imaging apparatus 102. In an embodiment, the electronic device 104 communicatively coupled to the imaging apparatus 102 may be configured to retrieve the images stored in the image storage unit 126 associated with the imaging apparatus 102. For instance, the images may include a black and white image(s), a color image(s), an Inner Crack Imaging (ICI) image(s), a previously scanned image using the imaging apparatus 102 such as AOI machine(s), an image(s) from the image storage unit 126 or a centralized storage unit (not shown), an image(s) obtained in real-time from the imaging apparatus 102 such as AOI machine(s), and so on. The electronic device 104 is then configured to load from an external database (not shown) or from the storage unit 116 associated with the electronic device 104, at least one of reference image corresponding to at least one of a black and white reference image, a color reference image, an ICI reference image, that is representing the same scanned area of the wafer with an inspected image without defects in wafer. Further, the electronic device 104, is configured to provide reference image and the wafer image with relevant modalities to the deep learning module 122. In one aspect of the present disclosure, the plurality of deep learning models or deep learning classifier may be trained with different types of classification of defects in the wafer. The plurality of deep learning models or deep learning classifier can be at least one of, but not limited to, a Convolutional Neural Networks (CNN) (such as LeNet, an AlexNet, a VGGNet, a GoogleNet, a ResNet, and so on), a Recurrent Neural Networks (RNN), a Generative Adversarial Networks (GAN), a Random Forest algorithms, Autoencoders, and so on. The purpose of training several deep learning models is that each model may be created to proceed with a synergy of several modalities of the defects. Accordingly, several deep learning models may be created to individually train the classification process of all the defects with layers of defects, based on similarity and dissimilarities. In another instance, to shorten the training process and the number of images classified, a reference image to each one of the modality images may be added to architecture of each deep learning model. The reference images in the training process may lead in faster tuning or training of the deep learning internal parameters, by providing information to the deep learning module 122 regarding the internal relation between the inspected image and the reference image. Further, the deep learning module 122 trained to classify a specific defect for one wafer may also dynamically classify trained defects if the defects appear in different wafer. Accordingly, the training process can discard the common events such as underlying lithography and may concentrate on the actual defects.

In an example, the deep learning models may be connected as parallel architecture or tandem architecture. Further, the electronic device 104 may be configured to generate a classification decision of the wafer images, using a Direct Acyclic Graph (DAG) architecture of the plurality of deep learning models. For example, the trained plurality of deep learning models may be used from the deep learning module 122 and thereafter may be connected in a Direct Acyclic Graph (DAG) architecture for the classification process of the wafers images defects. Furthermore, the electronic device 104 may be configured to store the classified wafer images including an associated directory and metadata result (s) (i.e. defect metadata), in the external database or the storage unit 116 associated with the electronic device 104.

In another embodiment, the electronic device 104 may be configured to load the previously calculated and stored defect metadata, from the external database or storage unit 116 associated with the electronic device 104. For example, the metadata includes different features of the defect, but is not limited to, a size of defect, a histogram of defect, a maximum color or grey level value of the defect, a minimum color or grey level value of the defect, and so on. The electronic device 104 may be configured to calculate the features representing the metadata of the defect, if the defect metadata is not stored. The electronic device 104 may then be configured to provide the inspected image, reference image(s) and the defect metadata (i.e. metadata features of the defect) to the trained deep learning models. Accordingly, the electronic device 104 may be configured to generate a classification decision of the wafer images, using the Direct Acyclic Graph (DAG) architecture of the plurality of deep learning models. Further, the electronic device 104 may be configured to store the classified wafer images including an associated metadata result(s) (i.e. defect metadata), in the storage unit 116 associated with the electronic device 104 or the external database.

Also, the images and defects metadata may also be stored in an external database (not shown). For example, external storage may be used for a training process of the deep learning model/classifier. As an example, the images stored in the external database (or the image storage unit 126) can be the black and white, the color images, the ICI images, the previously scanned image by the AOI apparatus, the images containing wafer defects, false events and nuisance defects. The images may be labelled before being stored in the external database (or the image storage unit 126). For each defect found in the images that are stored in the external database (or the image storage unit 126), a set of metadata features extracted from the defect images are stored in the external database (or the image storage unit 126). The metadata defects features may be provided by a user or by the AOI scanner results (or metadata defects features may be created for the purpose of the data retrieving for the deep learning classifier). Further, the reference image (e.g. golden die) including references of the color reference image, the black and white reference image and or ICI reference image may also be stored in the external database. The reference images are the images of the same wafer. The external database may also be used for performing the training process of the deep learning models.

Embodiments herein use synergy between several modalities of wafer defect images for the classification decision. Further, by adding a mixture of modalities, information may be obtained from different sources such as the color image, the ICI, the black and white image, to classify the defect image. In addition to mixture of modalities, a reference image (example, golden die image) may be used for each modality. The advantage of the reference image provided to each modality image is to concentrate on the defect itself and not on the related underlying lithography of the defect image. This approach saves on processing power, memory utilization and saves time. Further, the reference image may be provided to the training process of the deep learning models that may significantly reduce the number of labelled images and the training epochs (i.e. when an entire dataset is passed both forward and backward through the deep learning neural network) required for convergence of the deep learning model.

Figure 2:
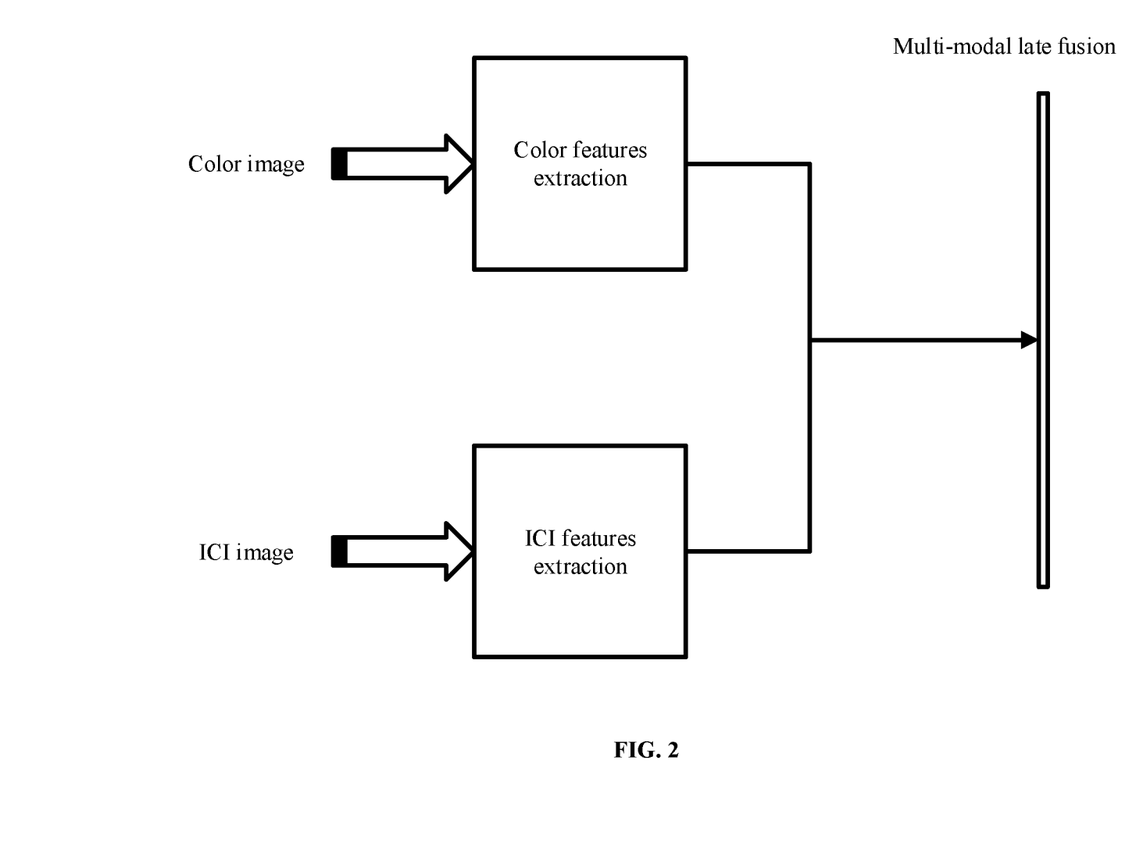
FIG. 2 illustrates a block diagram of multimodal late fusion deep learning model that can be used as one of the deep learning models for classifying defects in wafer using wafer defect images in accordance with some embodiments of the present disclosure.

FIG. 2 illustrates a block diagram of multimodal late fusion deep learning model that can be used as one of the deep learning models for classifying defects in wafer using wafer defect images in accordance with some embodiments of the present disclosure.

In an embodiment, the electronic device 104 comprises a multimodal Convolutional Neural Network (CNN) configured to integrate images acquired by different image sensors in one single forward pass. The deep learning model such as the multimodal late fusion deep leaning model may utilize two sensor images such as the ICI image by using a first deep learning model and the color image using a second deep learning model. Further, the multimodal CNN model includes a CNN model to encode the color image, and the ICI image separately and combining the decisions of both the CNN model, as shown in FIG. 2. The trained multimodal late fusion deep leaning model may be used for processing each modality to allow to take decisions separately for each modality. Finally, a central classification layer may provide a common decision making, based on the separate modalities.

Figure 3:
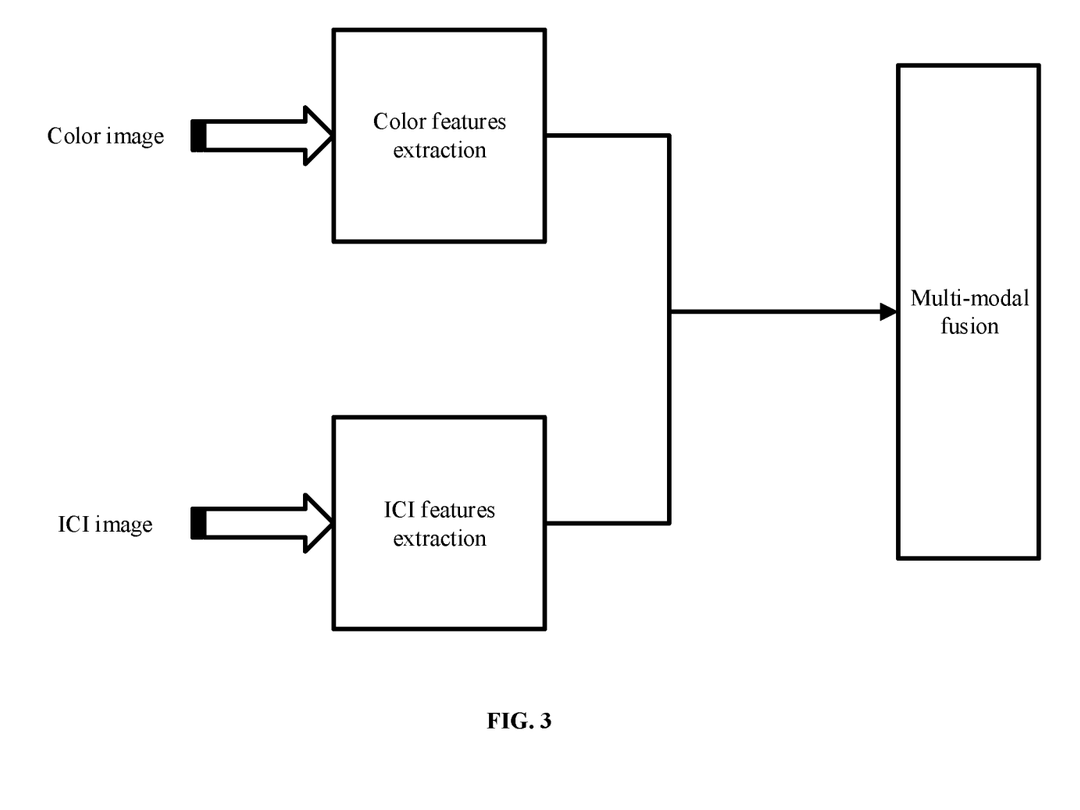
FIG. 3 illustrates a block diagram of multimodal hybrid fusion deep learning model that can be used as one of the deep learning models for classifying defects in wafer using wafer defect images in accordance with some embodiments of the present disclosure.

FIG. 3 illustrates a block diagram of multimodal hybrid fusion deep learning model that can be used as one of the deep learning models for classifying defects in wafers using wafer defect images in accordance with some embodiments of the present disclosure.

The multimodal CNN model such as multimodal hybrid fusion deep learning model may include a first CNN model for encoding the color image, and a second CNN model for encoding the ICI image, and third CNN model for joint representation of color and ICI defect images. The third/last CNN model may learn the inter-modal relationship between the color image and the ICI image before making a classification decision.

Figure 4:
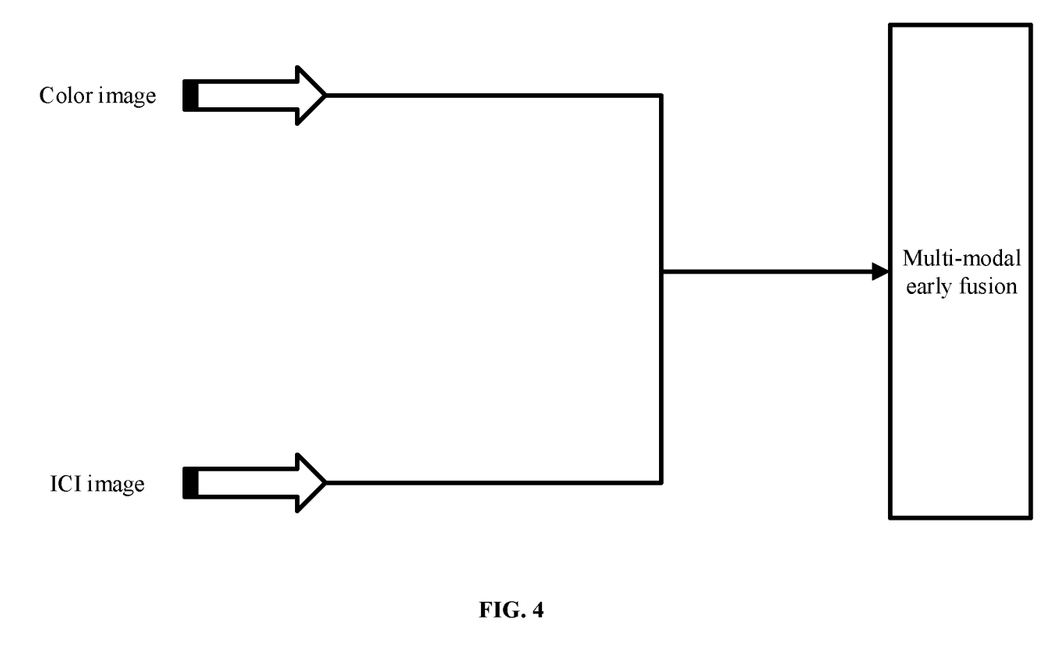
FIG. 4 illustrates a block diagram of multimodal early fusion deep learning model that can be used as one of the deep learning models for classifying defects in wafer using wafer defect images in accordance with some embodiments of the present disclosure.

FIG. 4 illustrates a block diagram of a multimodal early fusion deep learning model that can be used as one of the deep learning models for classifying defects in wafes using wafer defect images in accordance with some embodiments of the present disclosure.

The multimodal early fusion deep learning model may include a CNN model for joint representation of color defect images and the ICI defect images, by simultaneously processing the joint feature points in a single multimodal image.

Figure 5A:
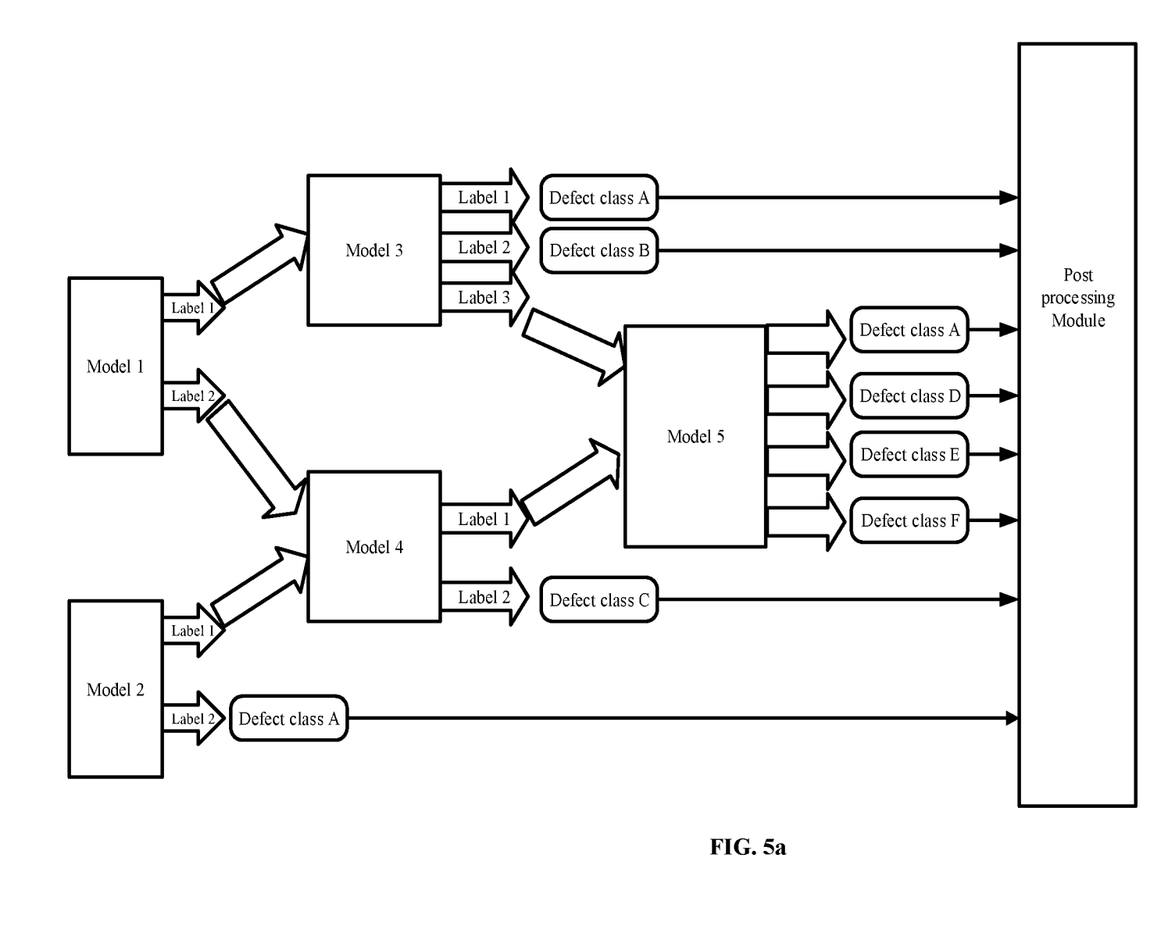
FIG. 5a illustrates a schematic diagram of DAG topology using a series of deep learning models in accordance with some embodiments of the present disclosure.

FIG. 5a illustrates a schematic diagram of DAG topology using a series of deep learning models in accordance with some embodiments of the present disclosure.

The plurality of deep learning models can be connected as a polytree that can be the Direct Acyclic Graph (DAG) of deep learning models whose underlying undirected graph can be a tree, as shown in FIG. 5a. The plurality of deep learning models can include the multimodal late fusion deep learning model, the multimodal hybrid fusion deep learning model, the multimodal early fusion deep learning model, deep learning models with single input images, autoencoders with one or two input images, and/or Generative Adversarial Network (GAN) deep learning models. The DAG can include a unique topological ordering and each deep learning model can be located in a node of the DAG. Further, each node may be connected directly to one or several previous nodes, and later to one or several nodes. Further, a resulting label of each deep learning model defines the flow path in the DAG. For example, the resultant images in "Model 1" to be "label 1" will continue to "Model 3" for evaluation, as shown in the FIG. 5a.

Figure 5B:
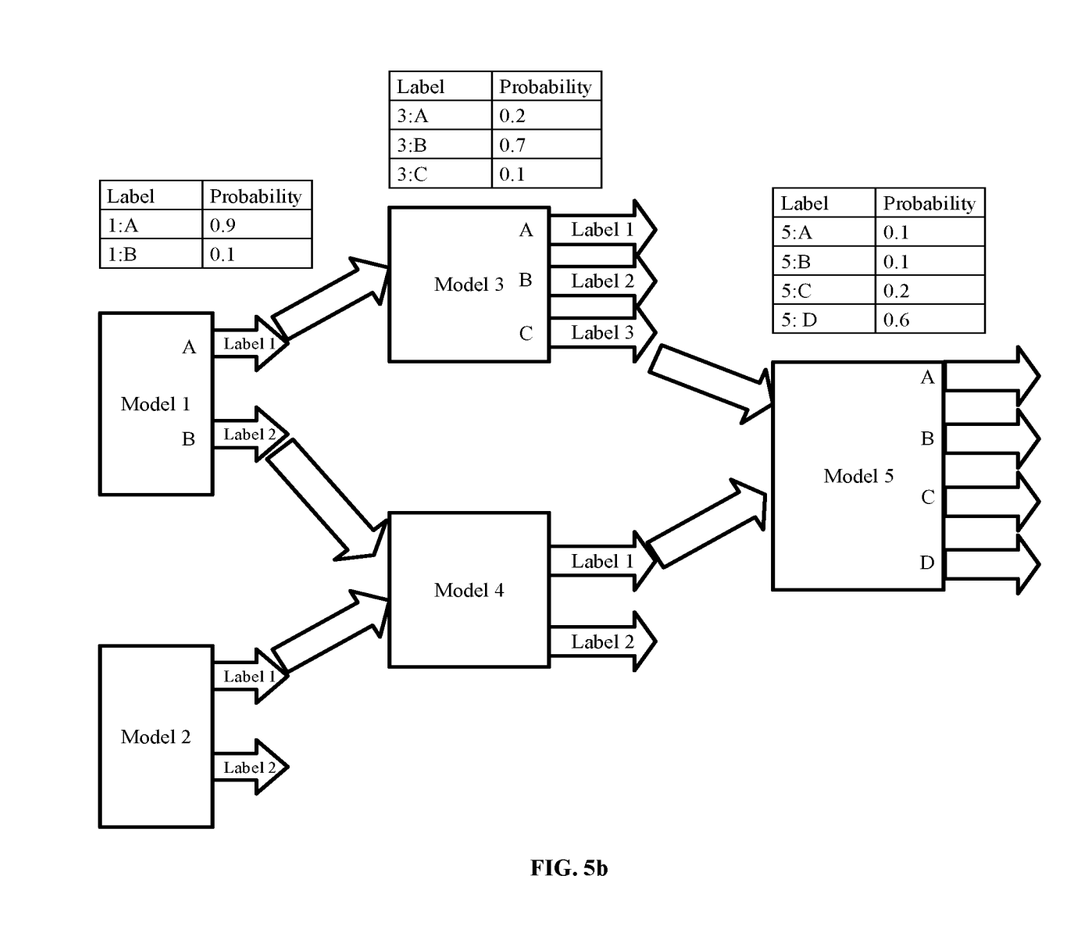
FIG. 5b illustrates a schematic diagram of exemplary resulting labels from each of deep learning models that defines the flow path in the DAG in accordance with some embodiments of the present disclosure.

As an example, consider the resulting labels of each models as depicted in FIG. 5b. The resulting label "label 1: A" in "Model 1", may have probability value of 0.9, and "label 1:B" may have a probability value of 0.1. Similarly, the resulting label "label 2:B" in "Model 3" may have probability value of 0.2, and "label 3:B" may have a probability value of 0.7, and "label 3:C" may have a probability value of 0.1. Further, the resulting label "label 5:A" in "Model 5" may have a probability value of 0.1, and "label 5:B" may have a probability value of 0.1, "label 5:C" may have a probability value of 0.2, and "label 5:D" may have a probability value of 0.6. Each deep learning model in the DAG can be unique and may be designed to handle a specific part of the classification problem. For example, one deep learning model in the DAG can be the ResNet model, another can be Google Net, and another can be a multimodal deep learning model. At the end of the DAG path, each image may be evaluated in the post process module (shown in FIG. 5a), where a decision may be taken based on the results of the deep learning models that interacted to this image.

Figure 6A:
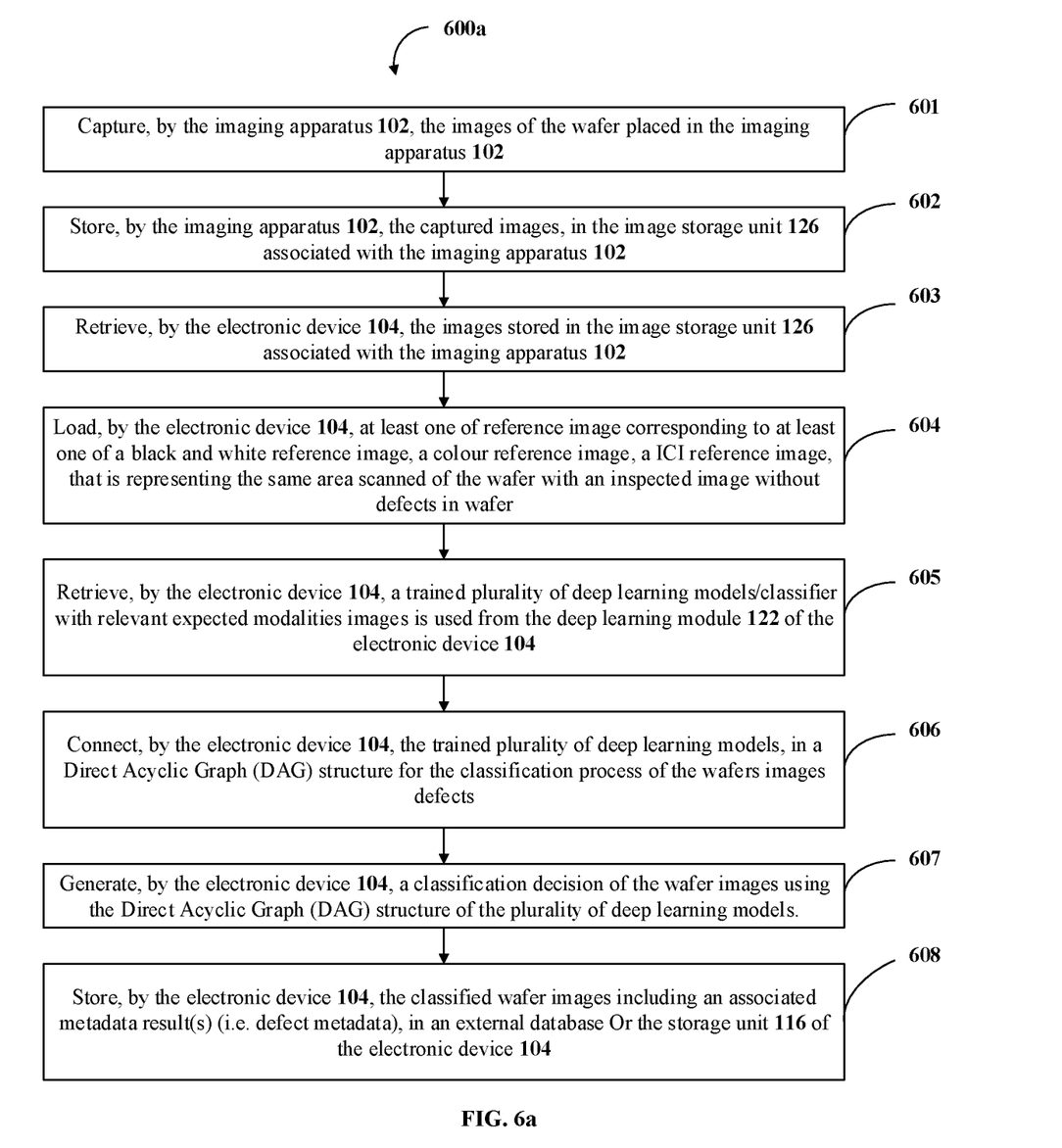
FIG. 6a is a flow depicting a method for classifying defects in wafer using wafer defect images, based on deep learning network in accordance with some embodiments of the present disclosure.

FIG. 6a is a flow depicting a method 600a for classifying defects in wafer using wafer defect images, based on deep learning network in accordance with some embodiments of the present disclosure.

At block 601, the images of the wafer are captured by the imaging apparatus 102. At block 602, the captured images are stored by the imaging apparatus 102 (FIG. 1), in the image storage unit 126 (FIG. 1) associated with the imaging apparatus 102. At block 603, the images stored in the image storage unit 126 associated with the imaging apparatus 102 is retrieved by the electronic device 104 (FIG. 1). At block 604, at least one reference image corresponding to at least one black and white reference image, a color reference image, a ICI reference image, that is representing the same area scanned of the wafer with an inspected image without defects in wafer, is received by the electronic device 104. At block 605, a trained plurality of deep learning models/classifier with relevant expected modalities images, is used by the electronic device 104, from the deep learning module 122 of the electronic device 104. At block 606, the trained plurality of deep learning models is connected by the electronic device 104 in a Direct Acyclic Graph (DAG) architecture for the classification process of the wafers images defects. At block 607, a classification decision of the wafer images is generated by the electronic device 104, using the Direct Acyclic Graph (DAG) architecture of the plurality of deep learning models. Finally, at block 608, the classified wafer images including an associated metadata result(s) (i.e. defect metadata), is stored in an external database or storage unit 116 of the electronic device 104, by the electronic device 104.

Figure 6B:
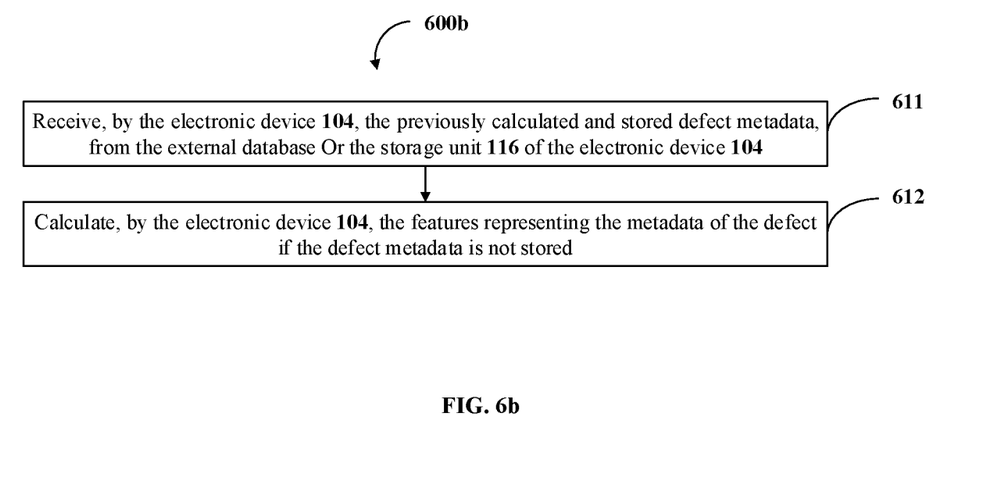
FIG. 6b is a flowchart depicting a method for calculating the features representing the metadata of the defect, if the defect metadata of the wafer defect images is not stored in the electronic device in accordance with some embodiments of the present disclosure.

FIG. 6b is a flow depicting a method 600b for calculating the features representing the metadata of the defect, if the defect metadata of the wafer defect images is not stored in the electronic device 104 in accordance with some embodiments of the present disclosure.

At block 611, the previously calculated and stored defect metadata, from the external database or storage unit 116 of the electronic device 104 is received by the electronic device 104. For example, the metadata includes different features of the defect, but is not limited to, a size of defect, a histogram of defect, a maximum color or grey level value of the defect, a minimum color or grey level value of the defect, and so on.

At block 612, the features representing the metadata of the defect is calculated by the electronic device 104, if the defect metadata is not stored.

Embodiments herein may utilize the Direct Acyclic Graph (DAG) as a combination of deep learning models, and each deep learning may treat a different aspect of the problem or a different modality of the defect in wafer using defect wafer images. Further, the DAG can be created having any number of models, plurality of different images (e.g. six images) per deep learning model. Further, the post processing decision module may be configured to combine parameters such as two aspects of the defect investigated images and resulting labels of the defect investigated images, a value(s) from each deep learning model of the DAG, and the metrology information (metadata) of the defect or collected previously in the scanner machine. The DAG comprising deep learning models may be used for accurately classifying the defects in wafer using wafer defect images, based on deep learning network.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended. For example, as an aid to understanding, the detail description may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following detailed description.

REFERENCE NUMERALS

| Reference Number | Description |
| --- | --- |
| 100 | System |
| 102 | Imaging apparatus |
| 104 | Electronic device |
| 106 | Communication network |
| 108 | Light source |
| 110 | Camera lens |
| 112 | Defect detection module |
| 116 | Storage unit |
| 118 | Processor |
| 120 | I/O interface |
| 122 | Deep learning module |
| 126 | Image storage unit |

What is claimed is:

1. A method of classifying defects in semiconductor wafers, the method comprising:
providing one or more imaging units of different imaging modalities configured to capture images;
providing a computing unit;
providing two or more Machine Learning (ML) models from a plurality of ML models, the two or more ML models being associated with at least a computer processor, a database, and a memory of the computing unit, wherein the two or more ML models are trained to classify one or more defects on one or more dies in one or more semiconductor wafers, wherein the training of the two or more ML models comprises:
providing a plurality of labelled images of the one or more semiconductor wafers stored in the database to the two or more ML models, and
configuring each ML model from the two or more ML models to classify the plurality of labelled images into at least one defect class;
connecting the trained two or more ML models in a Directed Acyclic Graph (DAG) architecture, wherein the DAG architecture comprises non-leaf nodes and a terminal node, wherein at least some non-leaf nodes in the DAG architecture represent respective ML models, wherein the terminal node represents a post-processing process, wherein the non-leaf nodes comprise one or more root nodes, wherein each of the one or more root nodes does not have any incoming edge thereto,
wherein the DAG architecture comprises at least a first path and a second path, the first path starts a root node and ends at the terminal node, the first path comprises a first number of non-leaf nodes, wherein the second path starts at the root node and ends at the terminal node, the second path comprises a second number of non-leaf nodes, the first number is larger than the second number,
wherein the DAG architecture comprises a node that represents a respective ML model, wherein the DAG architecture comprises: a first edge and a second edge, wherein the first edge is associated with a first predicted label of a first defect class, the first edge is outgoing from the node and incoming to another non-leaf node, wherein the second edge is associated with a second predicted label of a second defect class, the second edge is outgoing from the node and incoming to the terminal node; and
inspecting one defect located on a die contained on a semiconductor wafer by:

receiving at least one image from the one or more imaging units, the at least one image representing the one defect taken from the die in the semiconductor wafer, determining if at least one ML model in a DAG architecture is skipped based on an output of a previous ML model in the DAG architecture, wherein if the at least one ML model is skipped than the at least one image is not inputted to the at least one ML model determined to be skipped, classifying the one defect by non-skipped ML models in accordance with the DAG architecture, wherein the non-skipped ML models exclude the at least one skipped ML model, whereby obtaining classification decisions of the non-skipped ML models, generating a classification decision of the one defect by performing post-processing that is associated with the terminal node, the post-processing is performed based on the classification decisions of the non-skipped models, and outputting the generated classification decision.

2. The method of claim 1, wherein the two or more ML models are provided with a plurality of images belonging to the different imaging modalities.

3. The method of claim 1, wherein each of the two or more ML models is one of: a supervised model, a semi-supervised model, and an unsupervised model.

4. The method of claim 1, wherein the imaging modalities includes at least one of: X-ray imaging, grayscale imaging, black and white imaging, and color imaging.

5. The method of claim 1, wherein each of the two or more plurality of ML models are deep learning models.

6. The method of claim 1, wherein the plurality of labelled images comprises labels related to the at least one defect class, wherein the plurality of labelled images is generated using historical images of the one or more semiconductor wafers.

7. The method of claim 1, wherein said post-processing includes utilizing metrology information in combination with the classification decisions of the non-skipped ML models to determine the classification decision of the one defect.

8. The method of claim 7, wherein the metrology information comprises a size measurement of the one defect.

9. The method of claim 1, wherein said classifying the one defect is performed by utilizing the non-skipped ML models that are included in the first path, wherein the method further comprises:

generating a classification decision of a second defect located on the die contained on the semiconductor, wherein said generating the classification decision of the second defect comprises classifying the second defect by utilizing a second set of ML models that are included in the second path, wherein the classification decision of the one defect is performed by utilizing a larger number of ML models compared to a number of ML models utilized for the classification decision of the second defect.

10. The method of claim 1, wherein the training of the two or more ML models comprises:

providing a first set of images of the plurality of labelled images to a first ML model of the two or more ML models and configuring the first ML model to classify the first set of images into the at least one defect class, and providing a second set of images of the plurality of labelled images to a second ML model of the two or more ML models and configuring the second ML model to classify the second set of images into the at least one defect class, wherein the first set of images is different from the second set of images.

11. The method of claim 10, wherein the first set of images has a first imaging modality and the second set of images has a second imaging modality, wherein the first imaging modality is different from the second imaging modality.

12. The method of claim 1, wherein the training of the two or more ML models comprises:

configuring a first ML model of the two or more ML models to classify the plurality of labelled images into a first set of defect classes from the at least one defect class, and configuring a second ML model of the two or more ML models to classify the plurality of labelled images into a second set of defect classes from the at least one defect class, wherein the first set of defect classes is different from the second set of defect classes.

13. The method of claim 12, wherein a number of defect classes in the first set of defect classes is greater than a number of defect classes in the second set of defect classes.

14. The method of claim 1, wherein the imaging modalities include Inner-Crack Imaging.

15. A system for classifying defects in semiconductor wafers, the system comprising:

one or more imaging units of different imaging modalities;

two or more Machine Learning (ML) models, wherein the two or more ML models are trained to classify one or more defects on one or more dies in one or more, semiconductor wafers, wherein the training of the two or more ML models comprises:

providing a plurality of labelled images of the one or more semiconductor wafers stored in the database to the two or more ML models, and configuring each ML model from the two or more ML models to classify the plurality of labelled images into at least one defect class;

wherein the trained two or more ML models are connected in a Directed Acyclic Graph (DAG) architecture, wherein the DAG architecture comprises non-leaf nodes and a terminal node, wherein at least some non-leaf nodes in the DAG architecture represent respective ML models, wherein the terminal node represents a post-processing process, wherein the non-leaf nodes comprise one or more root nodes, wherein each of the one or more root nodes does not have any incoming edge thereto, wherein the DAG architecture comprises at least a first path and a second path, the first path starts a root node and ends at the terminal node, the first path comprises a first number of non-leaf nodes, wherein the second path starts at the root node and ends at the terminal node, the second path comprises a second number of non-leaf nodes, the first number is larger than the second number, wherein the DAG architecture comprises a node that represents a respective ML model, wherein the DAG architecture comprises: a first edge and a second edge, wherein the first edge is associated with a first predicted label of a first defect class, the first edge is outgoing from the node and incoming to another non-leaf node, wherein the second edge is associated with a second predicted label of second defect class, the second edge is outgoing from the node and incoming to the terminal node; and a computing unit, the computer unit including at least a computer processor, a database, and a memory, and being configured to: inspect one defect located on a die contained on a semiconductor wafer by:
- receiving at least one image from the one or more imaging units, the at least one image representing the one defect taken from the die in the semiconductor wafer,
- determining, if at least one ML model in the DAG architecture is skipped based on an output of a previous ML model in the DAG architecture, wherein if the at least one ML model is skipped than the at least one image is not inputted to the at least one ML model determined to be skipped,
- classifying the one defect by non-skipped ML models in accordance with the DAG architecture, wherein the non-skipped ML models exclude the at least one skipped ML model, whereby obtaining classification decisions of the non-skipped ML models,
- generating a classification decision of the one defect by performing post-processing, the post-processing is associated with the terminal node, the post-processing is performed based on the classification decisions of the non-skipped ML models, and
- outputting the generated classification decision.

16. The system of claim 15, wherein the one or more imaging units include at least one of: an Automated Optical Inspection (AOI) apparatus, an Automated X-ray Inspection (AXI) apparatus, a Joint Test Action Group (JTAG) apparatus, and an In Circuit Test (ICT) apparatus.

17. The system of claim 15, wherein the plurality of labelled images comprises labels related to the at least one defect class, wherein the plurality of labelled images is generated using historical images of the one or more semiconductor wafers.

18. The system of claim 15, wherein the post-processing includes utilizing metrology information in combination with the classification decisions of the non-skipped ML models to determine the classification decision of the one defect.

19. The system of claim 15, wherein said system is configured to generate a classification decision for the one defect by following the first path in the DAG architecture, wherein said system is configured to generate a second classification decision for a second defect by following the second path in the DAG architecture, wherein the classification decision of the one defect is performed by utilizing a larger number of ML models compared to a number of ML models utilized for the classification decision of the second defect.

* * * * *